(12) United States Patent
Lee et al.

(10) Patent No.: US 7,817,473 B2
(45) Date of Patent: Oct. 19, 2010

(54) FLASH MEMORY DEVICE WITH SPLIT STRING SELECTION LINE STRUCTURE

(75) Inventors: Jin-Wook Lee, Seocho-dong (KR); Sang-Won Hwang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 183 days.

(21) Appl. No.: 12/014,902

(22) Filed: Jan. 16, 2008

(65) Prior Publication Data
US 2008/0170440 A1 Jul. 17, 2008

(30) Foreign Application Priority Data
Jan. 17, 2007 (KR) ................. 10-2007-0005255

(51) Int. Cl.
*G11C 16/04* (2006.01)
(52) U.S. Cl. .................. 365/185.17; 365/185.18; 365/185.19; 365/185.23
(58) Field of Classification Search .......... 365/185.17, 365/185.18, 185.19, 185.23
See application file for complete search history.

(56) References Cited

U.S. PATENT DOCUMENTS

| 5,313,425 | A | * | 5/1994 | Lee et al. .................. 365/201 |
| 5,946,232 | A | | 8/1999 | Yoon |
| 5,969,990 | A | | 10/1999 | Arase |
| 6,370,062 | B2 | * | 4/2002 | Choi ..................... 365/185.23 |
| 6,549,461 | B2 | * | 4/2003 | Park et al. .............. 365/185.17 |
| 6,678,191 | B2 | * | 1/2004 | Lee et al. ............... 365/185.33 |
| 6,804,150 | B2 | * | 10/2004 | Park et al. .............. 365/185.18 |
| 6,987,694 | B2 | * | 1/2006 | Lee ........................ 365/185.17 |
| 7,095,656 | B2 | * | 8/2006 | Lee ........................ 365/185.29 |
| 7,212,439 | B2 | * | 5/2007 | Park ....................... 365/185.11 |
| 7,545,680 | B2 | * | 6/2009 | Kim et al. .............. 365/185.23 |

FOREIGN PATENT DOCUMENTS

| KR | 1019950010477 B1 | 9/1995 |
| KR | 100204342 B1 | 3/1999 |
| KR | 1020010003655 A | 1/2001 |
| KR | 1020020047770 A | 6/2002 |
| KR | 1020030013141 A | 2/2003 |

* cited by examiner

*Primary Examiner*—Connie C Yoha
(74) *Attorney, Agent, or Firm*—Volentine & Whitt, PLLC

(57) ABSTRACT

A flash memory device is disclosed and includes a memory cell array including a plurality of sectors. Each one of the plurality of sectors includes a plurality of strings, and each of the plurality of strings includes a plurality of memory cells series connected between a string select transistor and a ground select transistor. The flash memory device also includes a plurality of string selection lines, wherein each one of the plurality of string selection lines is respectively connected to string select transistors associated the plurality of strings in one of the plurality of sectors.

13 Claims, 4 Drawing Sheets

(Vssl1 > Vssl2)

FLASH MEMORY DEVICE WITH SPLIT STRING SELECTION LINE STRUCTURE

CROSS-REFERENCE TO RELATED APPLICATIONS

This U.S. non-provisional patent application claims priority under 35 U.S.C. §119 to Korean Patent Application No. 10-2007-0005255 filed on Jan. 17, 2007, the subject matter of which is hereby incorporated by reference.

BACKGROUND OF THE INVENTION

1. Field of the Invention

The present invention relates to a semiconductor memory device, and more particularly, to an electrically erasable programmable read only memory device, such as a flash memory device.

2. Description of the Related Art

Certain flash memory devices include a memory cell array composed of individual memory cells having floating gate transistors. The memory cell array typically includes a string arrangement of floating gate transistors, commonly referred to as a "NAND string" or "NAND unit". Within a NAND string, the floating gate transistors are series connected between a ground select transistor and a string select transistor. A plurality of word lines are arranged in the flash memory device to cross the NAND string. Each one of the plurality of word lines is connected to a control gate corresponding to a floating gate transistor in NAND string. The NAND string is also connected to corresponding bit lines.

Exemplary memory cell arrays are disclosed, for example, in Korean Patent Document No. 0626394. Exemplary memory cell arrays are also disclosed, for example, in U.S. Pat. Nos. 6,751,124 and 6,807,098, the collective subject matter of which is hereby incorporated by reference.

A NAND string in a memory cell array may be divided into a plurality of sectors adapted to perform read/program operations in sector units. When a read/program operation is performed in relation to a selected sector, read/program operations in relation to non-selected sectors are inhibited. Although the memory cell array is divided into the plurality of sectors, string select transistors associated with multiple sectors may be commonly controlled by a single string selection line. Since string select transistors associated with multiple sectors are commonly connected by a single string selection line in the conventional architecture, a program disturb phenomenon may occur in memory cells associated with one or more unselected sectors during a program operation. Moreover, since string select transistors associated with multiple sectors are commonly connected to a single string selection line, electrical current may be unnecessarily consumed in one or more unselected sectors during a read operation.

SUMMARY OF THE INVENTION

Embodiments of the invention provide a flash memory device having a split string selection line structure, and improved read/program operating characteristics.

In one embodiment, the invention provides a flash memory device, comprising; a memory cell array comprising a plurality of sectors, wherein each one of the plurality of sectors comprises a plurality of strings, and each of the plurality of strings comprises a plurality of memory cells series connected between a string select transistor and a ground select transistor, and a plurality of string selection lines, wherein each one of the plurality of string selection lines is respectively connected to string select transistors associated with a plurality of strings in one of the plurality of sectors.

DESCRIPTION OF EMBODIMENTS

Figure 1:
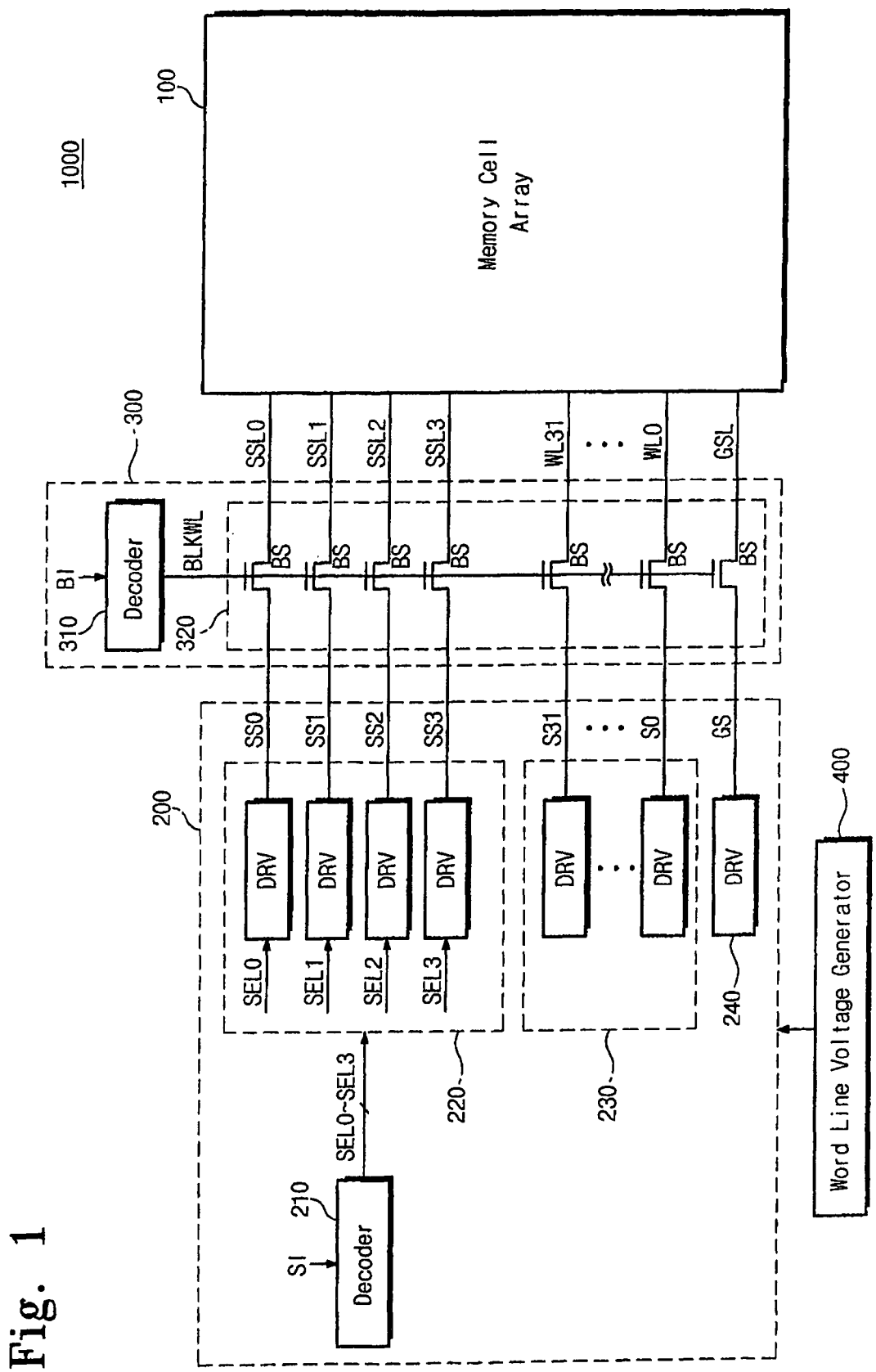
FIG. 1 is a block diagram of a flash memory device according to an embodiment of the invention.

Throughout the drawings and written description, like reference numerals and labels are used to indicate like or similar elements and signals with the illustrated embodiments.

The following embodiments are drawn to flash memory devices as examples of a broader class of non-volatile memory devices. Those skilled in the art will understand that the teachings presented in relation to the illustrated embodiments may be extended to other devices and methods of operation. The present invention may be variously embodied and should not be construed as being limited to only the illustrated embodiments.

(FIG.) 1 is a block diagram of a flash memory device according to an embodiment of the invention. FIG. 2 is a circuit diagram further illustrating the memory cell array of FIG. 1. The example flash memory device is a NAND flash memory device. However, it will be apparent to those skilled in the art that the present invention may be applied to other non-volatile memory devices, such as PRAM, MROM, PROM, FRAM, CTF memory device, NOR flash memory device, etc.

Figure 2:
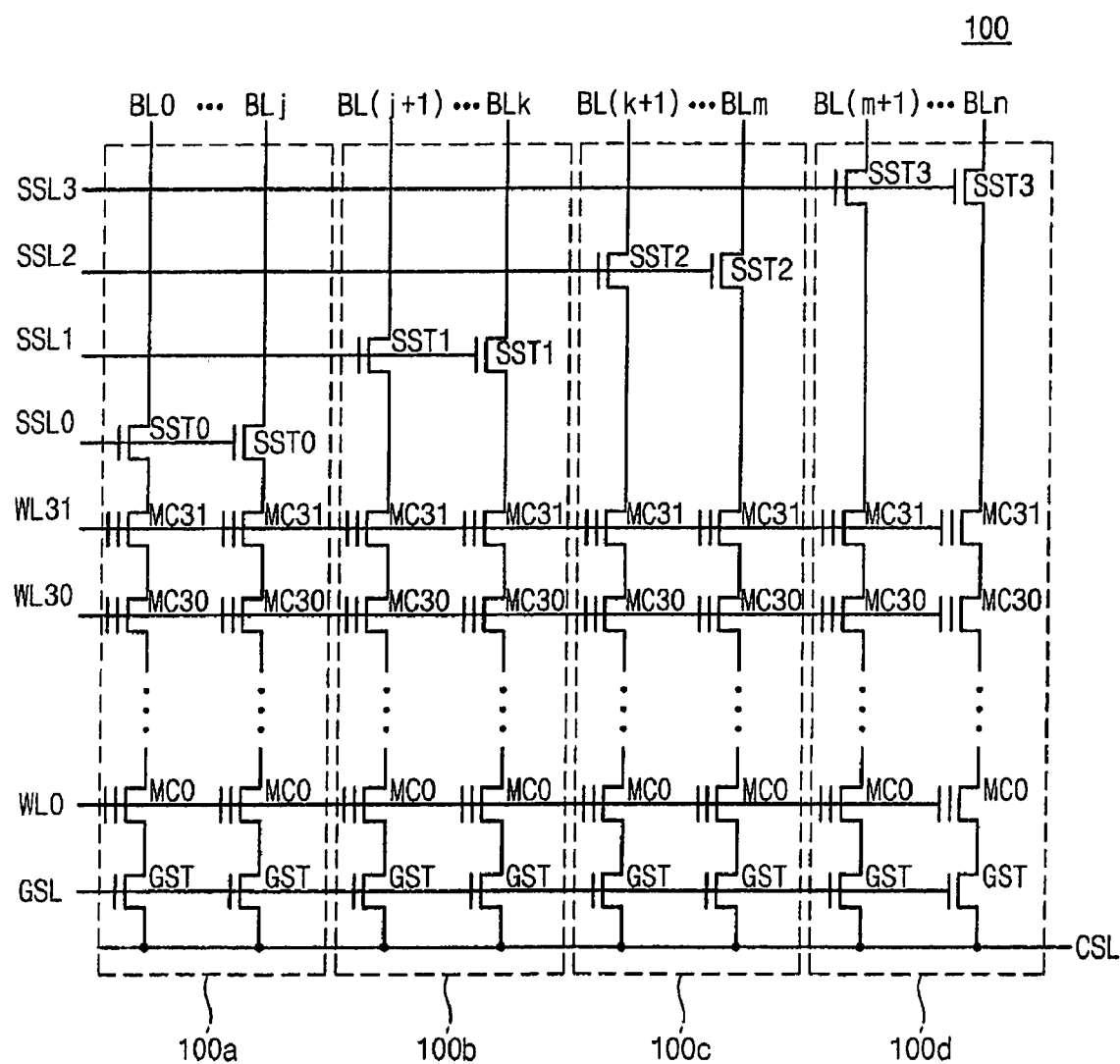
FIG. 2 is a circuit diagram further illustrating the memory cell array of FIG. 1.

Referring to FIG. 1, flash memory device 1000 comprises a memory cell array 100 composed of non-volatile memory cells adapted to store N-bit data, where N is a positive integer. Memory cell array 100 includes a plurality of defined memory blocks. Each one of the plurality of memory blocks includes a plurality of NAND strings. For convenience in description, only a single memory block is illustrated in relation to memory cell array 100.

Referring to FIG. 2, the single memory block of memory cell array 100 comprises a plurality of N sectors 100*a*, 100*b*, 100*c* and 100*d*, where N is assumed to range from 0 to 4 in the working example. Each one of the N sectors includes a plurality of NAND strings respectively associated with bit lines BL0 through BLn, and each one of the plurality of NAND strings in a sector includes a string select transistor SSTi, where i ranges from 0 to N, a ground select transistor GST, and a series connected plurality of memory cells MC31 to MC0 between a select transistor SSTi and ground select transistor GST.

According to an embodiment of the invention, each string select transistor SST1 associated with a NAND string in a sector is connected to a corresponding string selection line SSLi, again where i ranges from 0 to N. For example, first string select transistors SST0 associated with a first sector 100*a* are commonly connected to a first string selection line SSL0. Second string select transistors SST1 associated with sector 100*b* are commonly connected to second string selection line SSL1. Third string select transistors SST2 associated with sector 100*c* are commonly connected to a third string selection line SSL2, and fourth string select transistors SST3 associated with sector 100d are commonly connected to a fourth string selection line SSL3.

Referring back to FIG. 1, flash memory device 1000 further comprises a first decoding and driving block 200, a second decoding and driving block 300, and a word line voltage generator 400.

In the illustrated example, first decoding and driving block 200 comprises a first decoder 210, a first driving circuit 220, a second driving circuit 230, and a third driving circuit 240. First decoder 210 generates N select signals (e.g., SEL0 to SEL3) in response to received sector select information (SI). The sector select information Si is used to select between the N sectors 100a, 100b, 100c and 100d during read/program operations.

First decoder 210 may be configured to activate one or more of the N select signals SEL0 to SEL3 in relation to the sector select information Si. The form and derivation of the sector select information Si may vary between embodiments of the invention. For example, the sector select information Si may be generated in relation to a column address. The sector select information Si may be externally provided.

First driving circuit 220 is responsive to the N select signals SEL0 to SEL3 to drive N signal lines SS0, SS1, SS2 and SS3 that correspond respectively to the N string selection lines SSL0 to SSL3, with a string selection line voltage. More specifically, assuming that a first select signal SEL0 is activated and the other select signals SEL1 to SEL3 are deactivated, a first signal line SS0 is driven with the string selection line voltage while the other signal lines SS1 to SS3 are held at ground voltage or a voltage lower than the string selection line voltage.

Second driving circuit 230 may be configured to drive the word signal lines S0 to S31, which respectively correspond to the word lines WL0 to WL31, with various operating voltages (e.g., a pass voltage, a program voltage, etc.) related to a current operation (e.g., a read, erase, or program operation). In the illustrated example, second driving circuit 230 comprises a plurality of drivers DRV respectively connected to the plurality of word signal lines. One of the plurality of drivers DRV may be selected by a page address leaving the other drivers unselected. During a program operation, a selected driver DRV in second driving circuit 230 may be used to drive a corresponding word signal line with the program voltage, and the unselected drivers of second driving circuit 230 may be used to drive corresponding signal lines with the pass voltage.

Third driving circuit 240 may be configured to drive a ground selection signal line GS corresponding to a ground selection line GSL.

Referring to FIG. 1, second decoding and driving block 300 comprises second decoder 310 and a switch circuit 320. Second decoder 310 may be used to selectively activate a block word line BLKWL in response to received block select information BI. The block word line BLKWL may be driven with a high voltage such that voltages apparent on the N signal lines SS0 to SS3, word signal lines S31 to S0 and ground selection signal line GS are respectively driven onto the corresponding string selection signal lines SSL0 to SSL3, word lines WL31 to WL0 and ground selection line GSL with minimal voltage drop.

Switch circuit 320 in the illustrated example comprises a plurality of block select transistors BS respectively connecting the N signal lines SS0 to SS3, the word signal lines S31 to S0 and ground selection signal line GS with, respectively, the string selection lines SSL0 to SSL3, word lines WL31 to WL0 and ground selection line GSL. The plurality of block select transistors BS is commonly controlled by the block word line BLKWL. The block select transistors BS may be implemented using conventional high voltage transistors.

Word line voltage generator 400 may be configured to generate word line voltages (e.g., a read voltage, a program voltage, a pass voltage, etc.) associated with various operations.

As described above, when a program/read operation is directed to a selected sector, string select transistors pertaining to unselected sectors may be driven with a voltage lower than the string selection line voltage. Since string select transistors associated with each sector are independently controlled by a corresponding set of string selection lines, it is possible to reduce the occurrence of program disturbs during the program operation in memory cells disposed in the unselected sectors. Also, since string select transistors associated with each sector are independently controlled by a corresponding string selection line, it is possible to reduce unnecessary current consumption caused by unselected sectors during a read operation.

Figure 3:
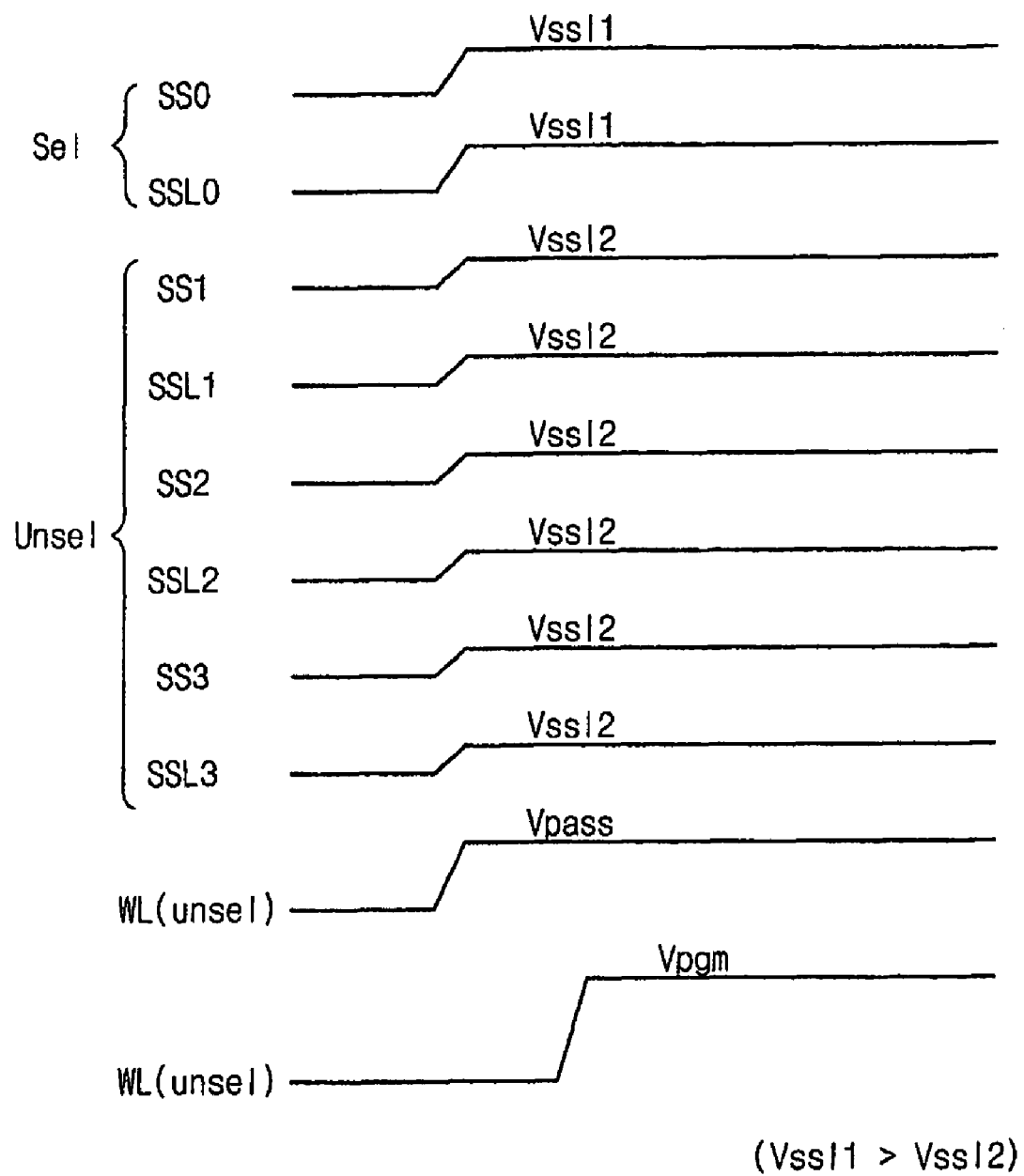
FIG. 3 is a timing diagram illustrating an exemplary program operation for a flash memory device according to an embodiment of the invention.

FIG. 3 is a related waveform timing diagram illustrating an exemplary program operation for a flash memory device according to an embodiment of the invention.

To perform the program operation, sector select information Si is provided to flash memory device 1000. Assuming, for convenience in description, that a program operation is to be performed in relation to a selected sector (e.g., sector 100a), first decoder 210 of first decoding and driving block 200 activates a first select signal SEL0 and deactivates other select signals SEL1 to SEL3 in relation to the received sector select information SI.

A corresponding driver in first driving circuit 220 drives a first signal line SS0 with a string selection line voltage Vssl1 in response to the activated select signal SEL0. At the same time, drivers in first driving circuit 220 drive corresponding signal lines SS1 to SS3 with a voltage Vssl2 lower than the string selection line voltage Vssl1 in response to the deactivated select signals SEL1 to SEL3.

Simultaneously, second driving circuit 230 of first decoding and driving block 200 drives word signal lines corresponding to unselected word lines with a pass voltage Vpass in response to a page address. N signal lines SS0 to SS3, word signal lines S0 to S3 and ground signal line GS may be electrically connected with corresponding string selection signal lines SSL0 to SSL3, word lines WL0 to WL31, and ground selection signal line GSL through second decoding and driving block 300.

According to the working example, N signal lines SS0 to SS3, word signal lines S0 to S31 and ground signal line GS may be electrically connected to the corresponding string selection signal lines SSL0 to SSL3, word lines WL0 to WL31 and ground selection signal line GSL through second decoding and driving block 300 in conjunction with the first decoding and driving block 200. Afterwards, second driving circuit 230 of first decoding and driving block 200 drives the word signal line corresponding to the selected word line with a program voltage Vpgm. Under this bias condition, a program operation may be performed in conventional manner.

As described above, the voltage Vssl2 applied to string selection lines corresponding to the unselected sectors is lower than the string selection line voltage Vssl1. Since the voltage Vssl2 lower than the string selection line voltage Vssl1 is applied to the string select transistors SSTi pertaining to the unselected sectors, it is possible to reduce program disturbs in program-inhibited cells pertaining to the unselected sectors. That is, a voltage of the string selection line may be increased due to a coupling between the string selection line and the word selection line during a program operation, thereby causing a channel of the program-inhibited memory cell to be lowered. Accordingly, a program disturb may occur in the program-inhibited memory cell. According to an embodiment of the present invention, however, since a voltage applied to the string selection line(s) of the unselected sector(s) is lower than the string selection line voltage, a rate of a voltage increase due to the coupling can be reduced.

Figure 4:
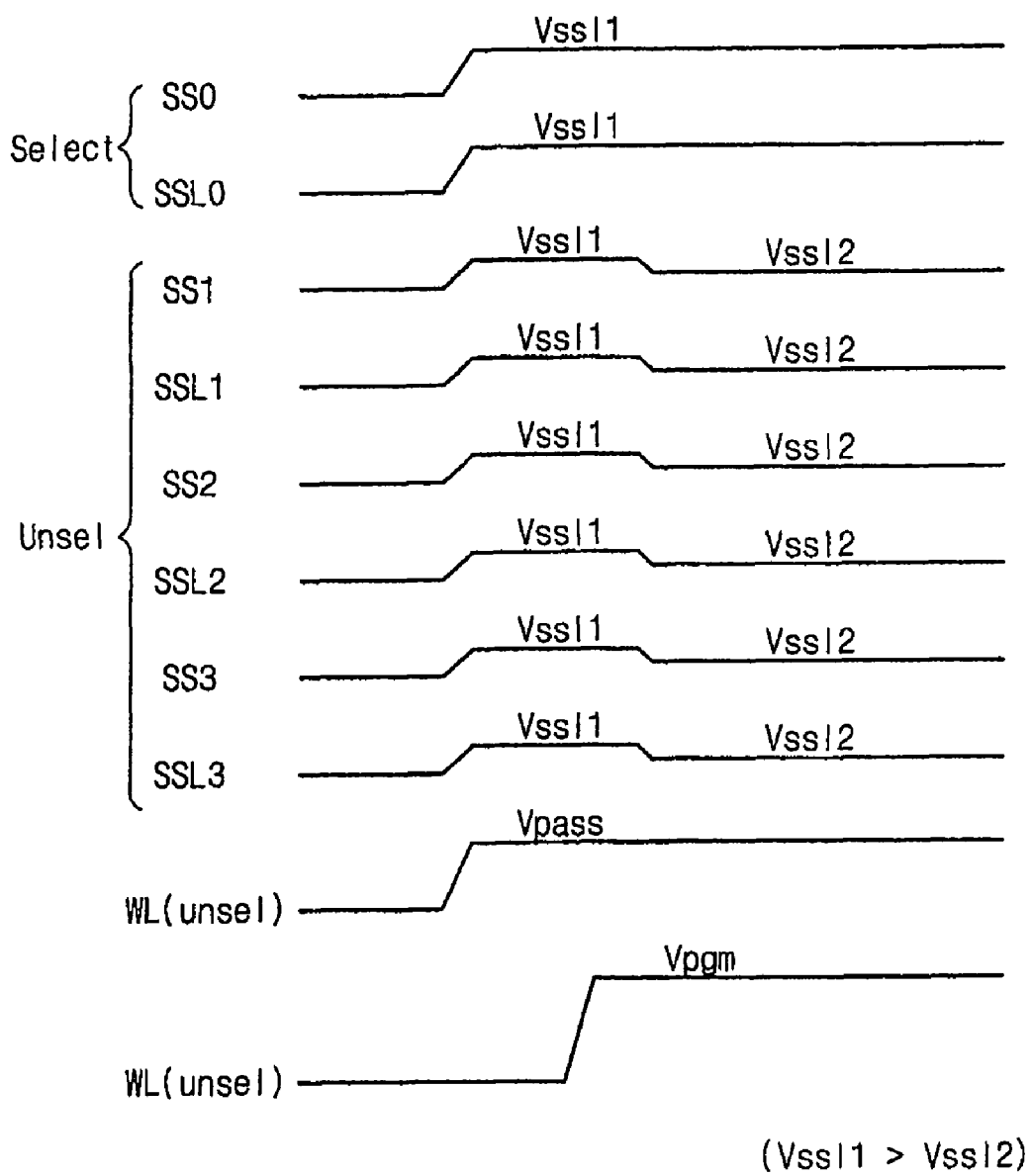
FIG. 4 is a timing diagram illustrating an exemplary program operation of a flash memory device according to another embodiment of the invention.

It will be apparent to those skilled in the art that the string selection lines of the unselected sectors can be driven in various ways. For example, as illustrated in FIG. 4, the string selection lines SSL0 to SSL3 may be driven with the string selection line voltage Vssl1 for a predetermined time at the beginning of an operation. Thereafter, the string selection lines pertaining to the unselected sectors may be driven with a voltage Vssl2 lower than the string selection line voltage Vssl1.

In flash memory device 1000, a voltage applied to a string selection line corresponding to an unselected sector may be determined in relation to a voltage that will turn OFF the string select transistors associated with the unselected sectors during a read operation. Alternatively, the voltage of the string selection line corresponding to an unselected sector may be determined to restrict a current flowing through the string select transistors pertaining to the unselected sectors. As such, it is possible to reduce the amount of current consumed by unselected sector(s) during the read operation.

Although an exemplary embodiment including four sectors has been described herein, it will be apparent to those skilled in the art that the present invention may be also applied to an array structure including any reasonable number of sectors.

The above-disclosed subject matter is to be considered illustrative, and not restrictive, and the appended claims are intended to cover all such modifications, enhancements, and other embodiments, which fall within the scope of the invention. Thus, to the maximum extent allowed by law, the scope of the invention is to be determined by the broadest permissible interpretation of the following claims and their equivalents.

What is claimed is:

1. A flash memory device, comprising:
a memory cell array comprising a plurality of memory blocks, each memory block comprising a plurality of sectors, wherein respective sectors in the plurality of sectors are arranged vertically adjacent to one another along a horizontally disposed plurality of word lines, each sector comprising a plurality of strings, and each string comprising a plurality of memory cells series connected between a string select transistor and a ground select transistor; and
a plurality of string selection lines, wherein each string selection line is respectively connected to only the string select transistors associated with the plurality of strings in a single one of the plurality of sectors.

2. The device of claim 1, further comprising a first decoding and driving block and a second decoding and driving block configured to select one of the plurality of string selection lines in response to selection of a corresponding one of the plurality of sectors by a data access operation directed to the flash memory device.

3. The device of claim 2, wherein the first and second decoding and driving blocks are further configured to drive a string selection line voltage onto the selected one of the plurality of string selection lines during the operation.

4. A flash memory device, comprising:
a memory cell array comprising a plurality of memory blocks, each memory block comprising a plurality of sectors, wherein the respective sectors in the plurality of sectors are arranged vertically adjacent to one another along a horizontally disposed plurality of word lines, each sector comprising a plurality of strings, and each string comprising a plurality of memory cells series connected between a string select transistor and a ground select transistor;
a plurality of string selection lines, wherein each string selection line is respectively connected to only the string select transistors associated with the plurality of strings in a single one of the plurality of sectors;
a first decoding and driving block and a second decoding and driving block configured to select one of the plurality of string selection lines in response to selection of a corresponding one of the plurality of sectors by a data access operation directed to the flash memory device,
wherein the first and second decoding and driving blocks are further configured to drive a string selection line voltage onto the selected one of the plurality of string selection lines during the operation, and
the first and second decoding and driving blocks are further configured to drive a voltage less than the string selection line voltage onto non-selected ones of the plurality of string selection lines during the operation.

5. The device of claim 4, wherein the voltage less than the string selection line voltage driven onto the non-selected ones of the plurality of string selection lines is a ground voltage.

6. The device of claim 5, wherein the first decoding and driving block comprises:
a first decoder receiving sector selection information and generating a plurality of select signals;
a first driving circuit comprising a plurality of drivers respectively receiving the plurality of select signals and respectively generating corresponding plurality voltages applied to signal lines corresponding to the plurality of string selection lines.

7. The device of claim 6, wherein the second decoding and driving block comprises:
a second decoder receiving block selection information and actuating a block word line in response to the block selection information; and
a plurality of high voltage transistor respectively connecting the signal lines corresponding to the plurality of string selection lines with the plurality of string selection lines.

8. The device of claim 6, wherein the sector select information is generated in relation to a column address for the memory cell array.

9. The device of claim 5, further comprising a plurality of word lines crossing the memory cell array, wherein the first and second decoding and driving blocks are further configured to a plurality of word line voltages onto the plurality of word lines, and the first decoding and driving block comprises:
a first decoder receiving sector selection information and generating a plurality of select signals;
a first driving circuit comprising a plurality of drivers respectively receiving the plurality of select signals and respectively generating a corresponding plurality voltages applied to signal lines corresponding to the plurality of string selection lines; and a second driving circuit comprising a plurality of drivers respectively generating various word line voltages applied to signal lines corresponding to the plurality of word lines.

10. The device of claim 9, wherein the second decoding and driving block comprises:
 a second decoder receiving block selection information and actuating a block word line in response to the block selection information; and
 a plurality of high voltage transistor respectively connecting the signal lines corresponding to the plurality of string selection lines with the plurality of string selection lines and respectively connecting the signal lines corresponding to the plurality of word lines with the plurality of word lines.

11. The device of claim 1, wherein memory cells within the memory cell array are adapted to store N-bit data, wherein N is a positive integer.

12. The device of claim 1, wherein the plurality of string selection lines is arranged such that the string selection lines are collectively adjacent to one another.

13. The device of claim 12, wherein the plurality of string selection lines are disposed above the plurality of strings.

* * * * *